United States Patent [19]
Lee et al.

[11] Patent Number: 5,500,805
[45] Date of Patent: Mar. 19, 1996

[54] MULTIPLE SOURCE EQUALIZATION DESIGN UTILIZING METAL INTERCONNECTS FOR GATE ARRAYS AND EMBEDDED ARRAYS

[75] Inventors: Ven L. Lee, Los Altos Hills; William M. Dawson, San Jose, both of Calif.; Donald L. Doud, Spring, Tex.

[73] Assignees: Nsoft Systems, Inc., Santa Clara, Calif.; Compaq Computer Corporation, Houston, Tex.

[21] Appl. No.: 300,637

[22] Filed: Sep. 2, 1994

Related U.S. Application Data

[63] Continuation of Ser. No. 132,520, Oct. 6, 1993, abandoned.

[51] Int. Cl.$^6$ ............................................... G06F 17/50
[52] U.S. Cl. .................................... 364/491; 364/490
[58] Field of Search ................................. 364/488, 489, 364/490, 491

[56] References Cited

U.S. PATENT DOCUMENTS

| | | | |
|---|---|---|---|
| 4,024,561 | 5/1977 | Ghatalia | 257/365 |
| 4,485,390 | 11/1984 | Jones et al. | 257/404 |
| 4,803,636 | 2/1989 | Nishiyama et al. | 364/491 |
| 4,827,428 | 5/1989 | Dunlop et al. | 364/491 |
| 5,046,017 | 9/1991 | Yuyama et al. | 364/491 |
| 5,077,676 | 12/1991 | Johnson et al. | 364/489 |
| 5,079,717 | 1/1992 | Miwa | 364/490 |
| 5,231,590 | 7/1993 | Kumar et al. | 364/491 |
| 5,235,521 | 8/1993 | Johnson et al. | 364/489 |
| 5,247,455 | 9/1993 | Yoshikawa | 364/490 |
| 5,309,371 | 5/1994 | Shikata et al. | 364/491 |

OTHER PUBLICATIONS

"Circuit Placement for Predictable Performance" by Hauge et al., IEEE 1987, pp. 88–91.
Richman et al., "A Deterministic Algorithm for Automatic CMOS Transistor Sizing", IEEE Journal of Solid-State Circuits, vol. 23, No. 2, Apr. 1988.
Obermeier et al., "Combining Circuit Level Chnages with Electrical Optimization", University of California, Berkeley, CA 94720.
Liew et al., Circuit Reliability Simulator for Interconnect, Via, and Contact Electromigration, IEEE Transactions on Electron Devices, vol. 39, No. 11.

*Primary Examiner*—Vincent N. Trans
*Attorney, Agent, or Firm*—Steven F. Caserza; Flehr, Hohbach, Test, Albritton & Herbert

[57] ABSTRACT

In accordance with the teachings of this invention, matched performance of alternate sourced ASICs is achieved while still allowing for the smallest die size possible from each alternate source fabrication facility. In one aspect of this invention, the width of electrical interconnects are adjusted to compensate for differences in capacitances of a given interconnect path in devices fabricated by different fabrication facilities. In another aspect, transistor channel widths are adjusted to compensate for differences in capacitances of a given interconnect path in devices fabricated by different fabrication facilities. In yet another aspect of this invention, capacitance is added to the gates of transistors to decrease their speed, when manufactured by an inherently faster process.

3 Claims, 8 Drawing Sheets

MULTIPLE SOURCE EQUALIZATION DESIGN UTILIZING METAL INTERCONNECTS FOR GATE ARRAYS AND EMBEDDED ARRAYS

CROSS-REFERENCE TO RELATED APPLICATIONS

This application is a continuation of U.S. Ser. No. 08/132,520, filed Oct. 6, 1993 now abandoned.

TECHNICAL FIELD

This invention pertains to integrated circuits (ICs), and more particularly to application specific integrated circuits (ASICs) such as gate arrays, embedded arrays, and standard cells.

BACKGROUND

Most major segments of the integrated circuit industry have alternate sourcing. For example a purchaser can buy SRAMs, DRAMs, and microprocessors from more than one source (i.e., a company with IC fabrication facilities). Customers have always found it desirable to have alternate sourcing available for an assured supply and lower cost by virtue of the competition among the alternate sources.

In the early eighties, the leading ASIC vendors were vertically integrated, i.e. they provided the three key technologies required for successful ASICs. These key technologies are the CAD (Computer Aided Design), the ASIC technology (The ASIC products itself; the methodologies for design, simulation, and test; and guaranteeing that the silicon works to customer specifications), and the silicon fabrication facilities to manufacture the ASICs. These ASIC vendors guaranteed the ASICs would function properly and reliably only if the ASICs were produced using that vendor's CAD, ASIC Technology, and silicon fabrication facilities and process.

Thus, in this prior art system, once a customer decides on a specific ASIC vendor, the customer is locked into using and relying on that ASIC vendor. Once the ASIC goes to production the customer is dependent on that single silicon fabrication source. Any problems with this fabrication facility, process, or company will directly impact the production of the ASICs, upon which the customer's systems are based. In such a situation the customer can go to another ASIC vendor to obtain a newly designed ASIC chip to serve the same purpose, but this is costly, time consuming, and the newly designed ASIC chip may not perform the same.

In the mid 1980's CAD companies, such as Cadence, took advantage of the customer's desire for alternate sourcing by offering a set of CAD tools that offered the customers some independence from the ASIC vendors, as their CAD tools were suitable for use with any number of ASIC vendors. Customers quickly embraced this "open" CAD concept.

This open CAD concept was a step in the direction of alternate sourcing ASICs, but ASIC vendors still required the use of their specific ASIC Technology which was integrated to their silicon fabrication process. The precise timing models in the library of ASIC technology must represent the behavior of the ASIC devices when fabricated by the ASIC vendor. An ASIC vendor is only able to guarantee accurate timing in the ASICs manufactured by themselves, and cannot guarantee the ASIC will function the same if it is fabricated using another vendor's ASIC technology or fabrication process.

For many years, ASIC vendors have been porting libraries of their proprietary ASIC products to various software tools available from different CAD companies. This provides the systems designer with a wide choice in these front end tools. However, this approach does not provide the flexibility of allowing the systems designer to choose different semiconductor fabrication facilities and guarantee the same high performance, and in some cases even the same functionality, since different vendors, different fabrication processing techniques, etc. result in variations in device performance.

As in any market, customers desire an "alternate sourcing" of their ASICs. Today there is no method or system for the true alternate sourcing of ASICs. There have been attempts to provide alternate sourcing of ASICs by two ASIC vendors teaming up to second source products using as identical ASIC architecture and fabrication processes as possible. However, even in these instances where two or more vendors are actively pursuing identical fabrication techniques in each of their fabrication facilities, fabrication processes change over time due to different product priorities, yield enhancement techniques, use of different manufacturing equipment, etc., and thus device performance variations will increase over time. None of these attempts to second source ASICs have worked well over time. So, in spite of good intentions, alternate sourcing quickly becomes incompatible.

In array based products, such as gate arrays and embedded arrays, alternate sourcing generally does not exist. The main technical reason is the large number of macrocell library elements, which could number more than 100. These are based on a fixed primitive cell with predetermined transistor widths. It is impractical for a designer to adjust the width of each transistor to compensate for performance differences of different semiconductor processes for all the macrocells in the library. This is the main technical reason that alternate sourcing in ASICs does not exist. The only possible exception is if two companies agreed on the same architecture, library, design, methodology, design tools, same place and route software and methodology, and same semiconductor process technology. Because of customer insistence, there have been such attempts at alternate sourcing. However, different companies have different priorities and the semiconductor process technology tends to quickly drift apart and the alternate sourcing begins to fail.

At present, when a second source is needed, systems companies have no choice but to do an almost total redesign of the ASIC. Even then the ASIC components obtained from two separate ASIC vendors may or may not work the same on the customer's systems. The problem is that the second vendor's ASIC has a different architecture, different library elements, different timing performance, different methodology, different place and route, as well as a different fabrication process. The success rate of second sourcing leaves a lot to be desired.

In order to develop confidence that an ASIC will perform as desired or expected, the designer needs to perform accurate gate level simulation, including timing. Since each ASIC vendor has libraries with different timings and possibly different functional library elements, the systems customer now must select one ASIC vendor to which the simulation will be directed. Once the ASIC vendor selection is made, the simulation, place and route, timing adjustments for wire routing, and manufacturing will take a significant amount of time and effort. It is costly for the customer to duplicate this time and effort for an alternate source. The customer is in effect, due to time and cost constraints, locked in a sole sourced situation, meaning the customer can only buy from this one ASIC vendor.

In order for a customer to obtain a second source, the customer needs to duplicate the simulation on a different library, perform a different place and route which will provide different wire induced delays, and manufacture the gate array (generally a different architecture) on a different fabrication process. The odds are not good that the second sourced ASIC device will work the same after going through so many steps, each of them different from one another.

This situation increases the cost of the ASICs, but more importantly, a single source may not be able to meet demand. A single sourced vendor could have a yield problem resulting in an insufficient supply of ASICs, which in turn may stop production of the customer's electronic system which incorporates the ASIC. Or if the system sells much better than expected, a single source vendor most likely will not be able to increase production quickly enough to meet the customers demand for the ASICs.

FIG. 1A is a flow chart of a prior art attempt to provide alternate sourcing of a given basic circuit design from a plurality of vendors. As shown in FIG. 1A, a first step 201 is to define a device specification, including the system behavior and timing desired. Step 202 is a synthesis step, during which equivalent logic is synthesized into different libraries of different alternate sources. This results in a netlist for each source's library which is simulated for timing and functionality in steps 203-1 and 203-2. The results of step 202 are suitable for application to a plurality of ASIC vendors parameters, by simulation steps 203-1 and 203-2, in order to verify by simulation of gate level implementations of the specified functionality and timing specifications the expected operation of ASIC devices produced by each vendor. These simulation steps need to be done at least once per vendor because the primitive library elements are logically different and have different speeds.

This prior art also requires a duplication in the place and route steps 204-1 and 204-2, during which devices and interconnects are defined in accordance with each vendor's parameters. Place and route must be uniquely performed for each ASIC vendor in steps 204-1 and 204-2 because this step significantly impacts timing. Most likely the two vendors use different place and route algorithms. So step 204-2 must be redone until the timing can match the timing of the first source which utilized a different place and route step 204-1. Fabrication steps 205-1 and 205-2 are then performed by each vendor, in accordance with specific layout steps performed for that vendor. Thus, it is shown in the prior art flow chart of FIG. 1A that a number of steps required in order to allow each ASIC vendor to fabricate devices which are intended to be functionally identical are not themselves identical, and due to the variations in these steps are likely to lead to supposedly functionally identical ASICs from two vendors which, unfortunately, are all too often not as functionally identical as one would need or desire. For example, simulation steps 204-1 and 204-2 are performed according to the individual vendor parameters, and place and route algorithms result in a difference in location of various devices within each ASIC and different electrical interconnect lengths as well. Thus, in addition to the fact that a number of steps must be duplicated specifically for each vendor, the net result is a set of devices available from a plurality of vendors which all too often have significant disparities in operating characteristics.

The other approach to seeking a plurality of foundries for alternate sourcing is to recognize the performance difference of different foundries. Each foundry's performance can be depicted in the propagation delay, tpd, of a gate. This distribution is gaussian, and has a minimum and a maximum propagation delay, as shown in FIG. 1B. If we include the gaussian distributions of two foundries in one graph, as shown in FIG. 1B, we can take the smallest of the two minimum delays and call it the lower limit of both processes Tpd(min A+B). We can also take the largest of the two maximum delays and call it the upper limit of both processes Tpd(max A+B). These new lower limit and upper limit delays are the new minimum and maximum delays of a larger performance window for the combined delay distributions. We can now specify that a given gate's delay shall be within this new performance window which is larger than either performance window of source A or source B. Then a library is generated with this wide performance window. The system customer now needs to make sure his ASICs will operate over a larger performance window. He needs to guarantee that his chip will work in his system when a chip happens to have the slowest performance, the Maximum delay Tpd(max A+B), in the combined performance window. He also needs to guarantee that another chip which may have the highest performance, Minimum delay Tpd(minA+B), in the combined performance window will work the same way. This may mean that he needs to slow the system performance, making his product less competitive. At the other extreme there is higher performance. Higher performance means more power consumption. The higher maximum performance, minimum delay, may mean the need for larger heat sinks or fans to cool the ASICs, which make the system heavier and more costly, and will increase power consumption, which may lead to larger battery requirements if it is a portable system. So with this approach, a penalty is paid in power consumption and yet the system has to run at a lower speed.

SUMMARY

In accordance with the teachings of this invention, matched performance of alternate sourced ASICs is achieved while still allowing for the smallest die size possible from each alternate source fabrication facility. In one aspect of this invention, the width of electrical interconnects are adjusted to compensate for differences in capacitances of a given interconnect path in devices fabricated by different fabrication facilities. In another aspect, transistor channel widths are adjusted to compensate for differences in capacitances of a given interconnect path in devices fabricated by different fabrication facilities. In yet another aspect of this invention, capacitance is added to the gates of transistors to decrease their speed, when manufactured by an inherently faster process.

BRIEF DESCRIPTION OF THE DRAWINGS

FIG. 8b is a plan view of a portion of the structure of FIG. 8a; and

DETAILED DESCRIPTION

Figure 1A:
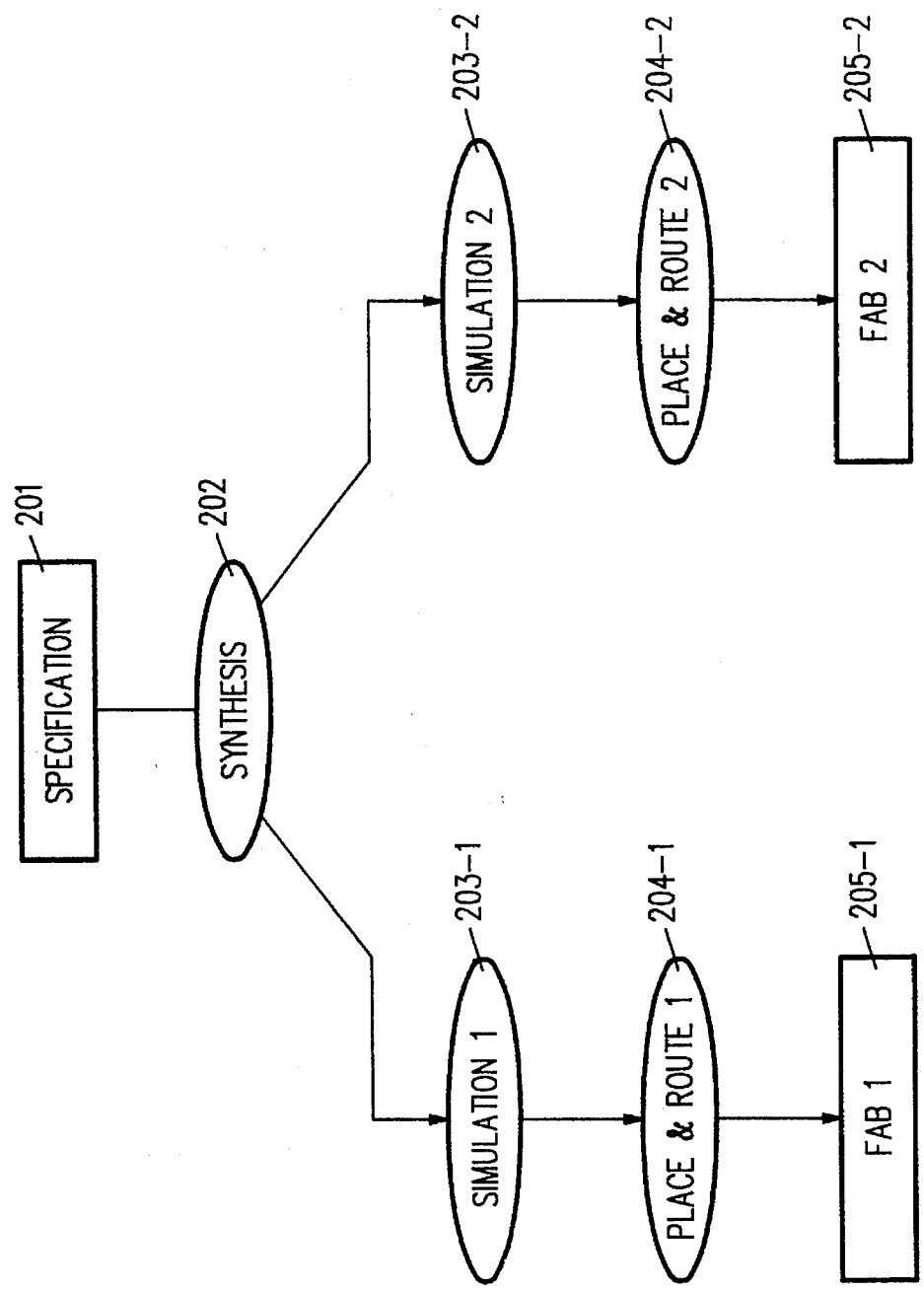
FIG. 1A is a diagram depicting how ASICs must be alternate sourced in the prior art.
Figure 1B:
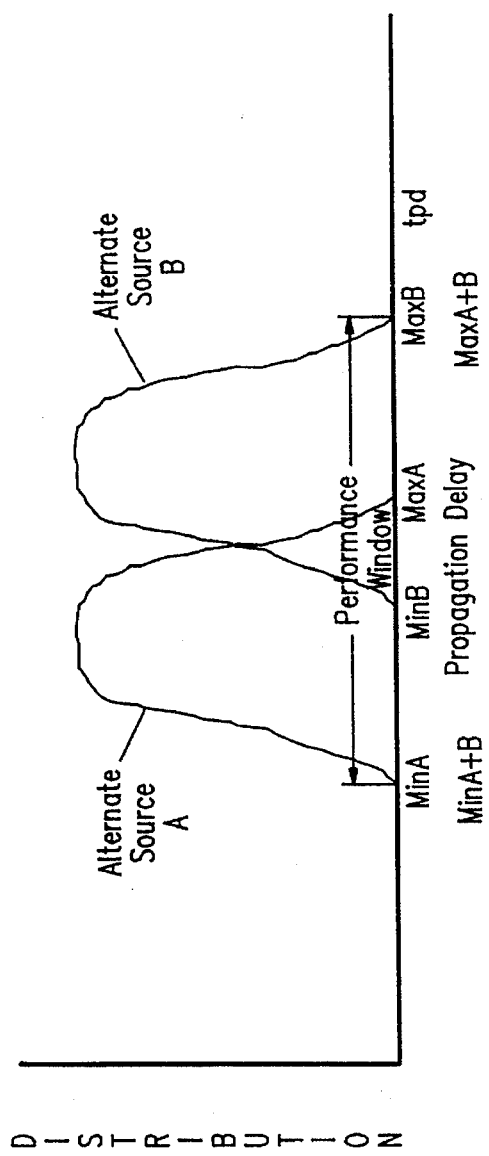
FIG. 1B is a graph showing the distribution of propagation delays of two alternate source fabrication facilities.
Figure 1C:
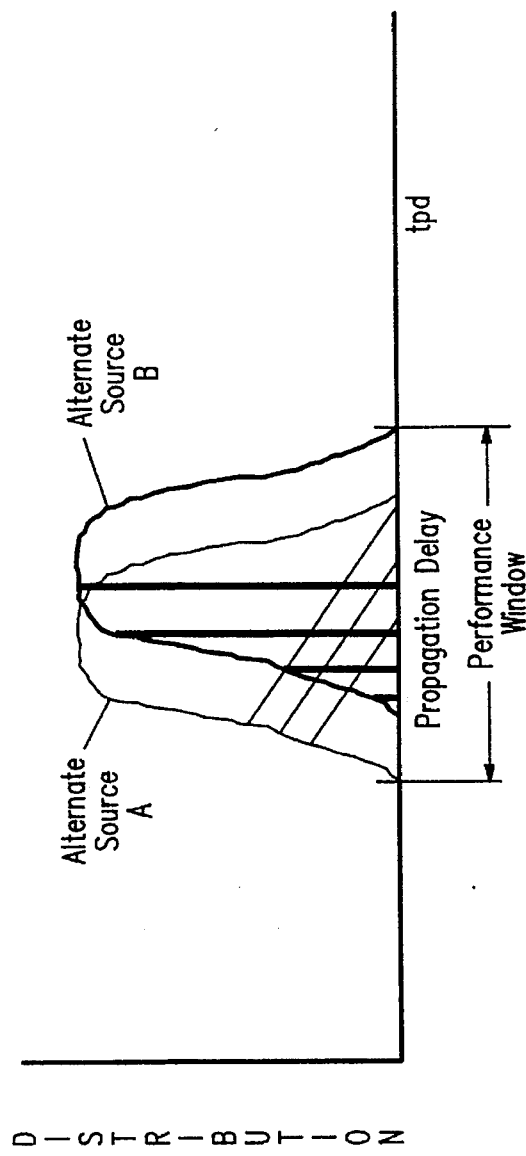
FIG. 1C is a graph showing the effective distribution of propagation delays of two alternate source fabrication facilities, in accordance with this invention.

In accordance with the teachings of this invention, a novel method is taught which allows for easy design adjustment to be made to an ASIC architecture in order to compensate for differences between a plurality of distinct semiconductor fabrication processes, each being semiconductor process technology of the same generation. While the exemplary embodiments described herein will refer to the alternate sourcing of integrated circuits from two separate fabrication facilities (and thus two separate fabrication processes), it is to be understood that the teachings of this invention apply equally well to a plurality of fabrication facilities and processes greater than two, and regardless of those facilities and processes are operated by the same or different companies to fabricate integrated circuits. By utilizing the teachings of this invention to allow identically performing integrated circuits to be fabricated from a plurality of separate fabrication facilities and processes, the resultant performance window is much narrower, as shown in FIG. 1C, allowing higher performance design than is possible using prior art methods of alternate sourcing. In one embodiment, this narrow performance distribution is used to develop a single library with common performance and functionality, regardless of which fabrication facility and process is used to fabricate integrated circuits. This library is incorporated in a design methodology that allows a customer to design a desired ASIC once, and obtain ASIC components with identical performance characteristics, regardless of which one of a plurality of alternate sources fabricates the devices.

Figure 3:
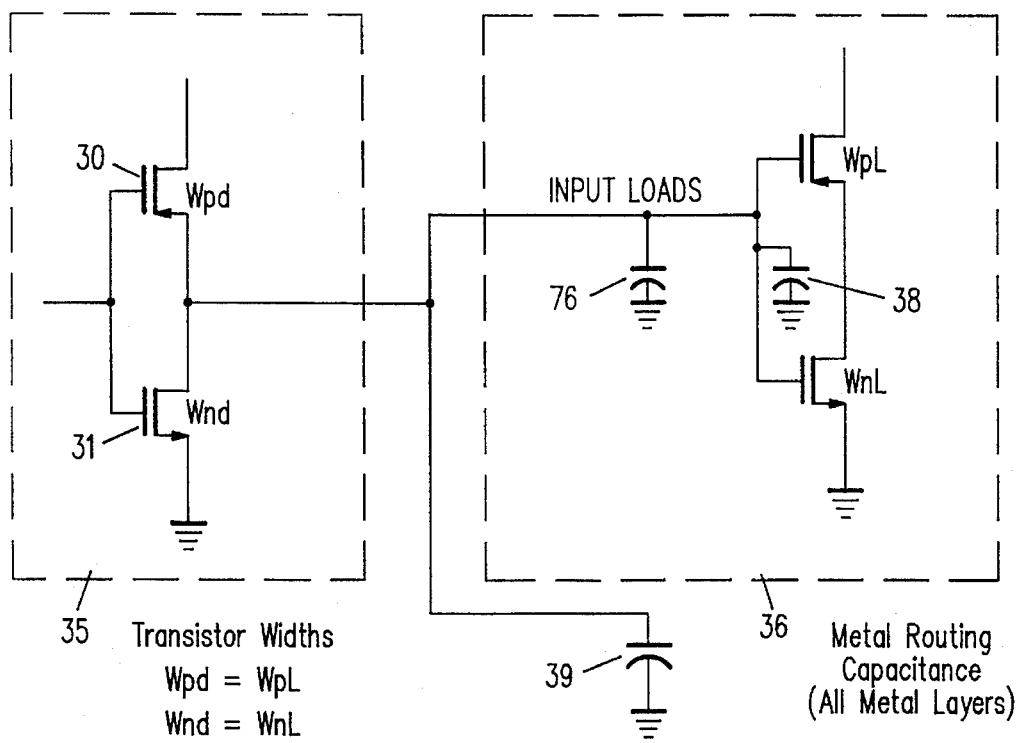
FIG. 3 is a schematic diagram depicting ASIC building block circuits and associated capacitances.

As depicted in FIG. 3, in accordance with the teachings of this invention, one embodiment of a gate array and embedded array architecture includes as a fundamental building block a single P channel transistor 30 of channel width Wpd, and a single N channel transistor 31 of channel width Wnd. As shown in FIG. 3, each such building block receives input signals from, and provides output signals to, others of such building blocks, as illustrated by building block 35 providing an output signal to the input of building block 36. These channel widths determine the current drive and therefore the speed of each transistor. This simple design allows Wpd and Wnd to be changed independently during the design of an ASIC. Since all functions are built from these two basic types of transistors, during design the width Wp of all P channel transistors can be changed by a certain percentage to compensate for variations in alternate source fabrication processes. Similarly, during design the width Wn of all N channel transistors can be changed by a certain percentage to compensate for variations in alternate source fabrication processes. In accordance with this invention, the widths of P channel and N channel transistors are changed independently of each other during design of an ASIC array in order to compensate for performance effects of variations among the alternate processes, whose performance variations differ for N channel versus P channel transistors among the various alternate fabrication processes.

It seems that it should follow that if we increase the channel width, we must be increasing the die size and therefore the component cost. However, it has been determined in accordance with this invention that this is not the case in the present invention, which allows a substantial increase in transistor channel widths without increasing the die size. Furthermore, in accordance with this invention, architecture is optimized to the minimum design rules of each fabrication process, meaning ASICs are designed to the smallest possible die size for each fabrication process. Thus the equalization of transistors, and thus ASIC devices, from a plurality of sources in accordance with this invention comes without an attendant increase in die size or cost.

Figure 7:
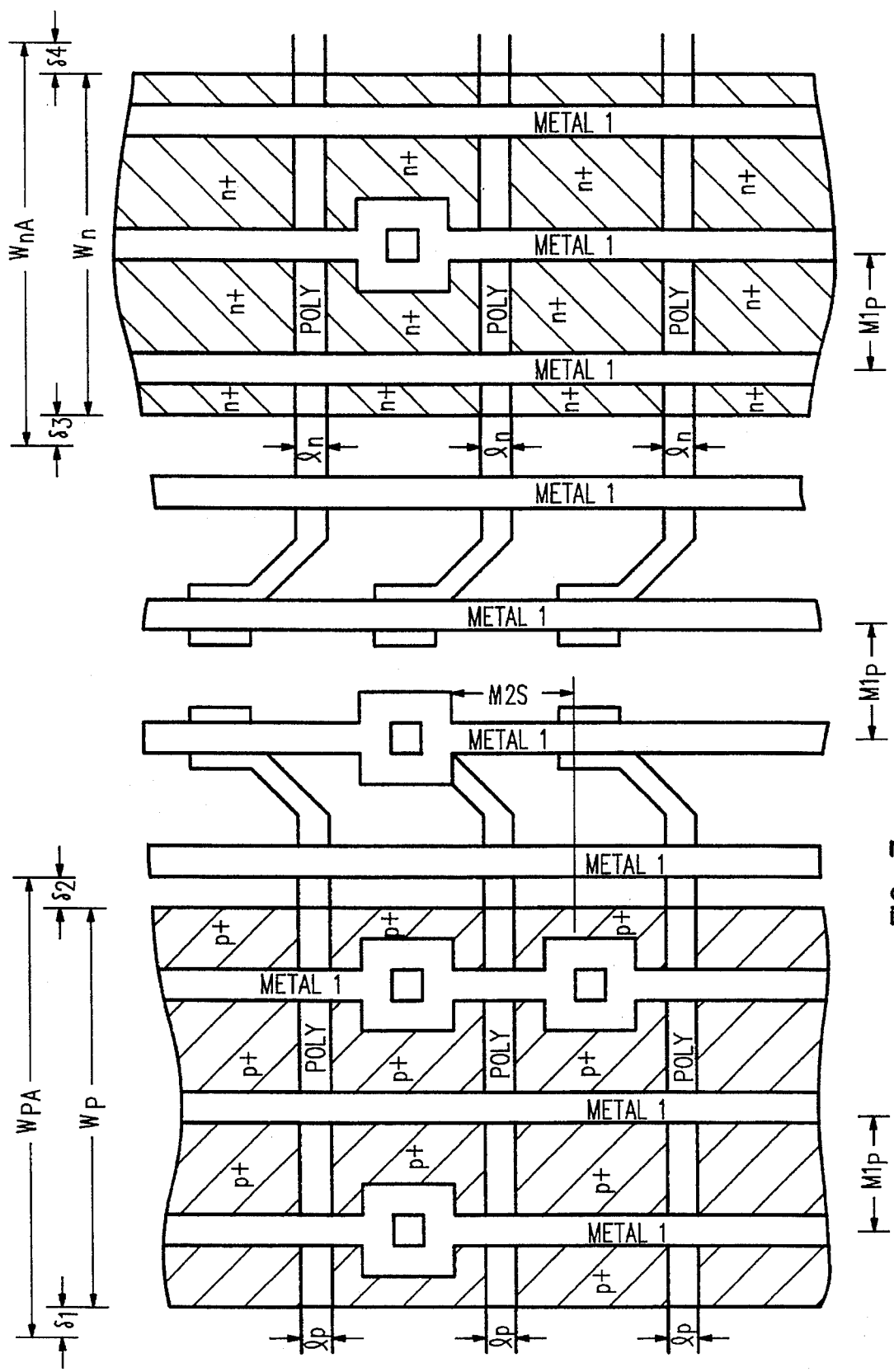
FIG. 7 is a plan view of one embodiment of an ASIC architecture showing the ability to increase transistor channel widths without affecting die size, in accordance with this invention.

The reason for this ability to provide alternate sourcing of ASICs by adjusting channel widths to compensate for performance variations among a plurality of sources without an increase in die size is, as recognized by this invention, that gate arrays are unique in that their die size, in the direction of concern with respect to transistor channel widths, is determined by the metal pitch, not by the diffusion design rules such as transistor channel widths. FIG. 7 shows first metal pitch, M1p and transistor channel widths, Wn (for N channel transistors) and Wp (for P channel transistors). Referring to FIG. 7, the P channel transistor width Wp, can be increased by δ1 and δ2 without changing the metal pitch, M1p. Therefore, by increasing the P channel transistor channel width from Wp to WpA, in order to optimize speed in order to match the performance of another process, the die size is not increased. Then, if needed, the channel width of N transistors is independently increased from Wn up to WnA, by δ3 and δ4. Thus, the N channel transistor width is adjusted independently of the adjustment in P channel transistor width, also without an increase in die size.

It has been determined in accordance with this invention that the metal pitch and number of desired metal interconnects allow channel widths to be subjected to an increase in size up to approximately 15–20%, as needed, in order to provide an increase in speed to match the speed of inherently faster processes of alternate sources. From analysis of three different 0.8 um processes it has been determined that this capability to adjust device speed by increasing channel width is more than sufficient to reduce the performance differences between same generation alternate source processes to within approximately 5% or less. Thus the method of this invention allows alternate sources to use different mask sets containing the minimum design rules of each fab thereby allowing minimum die sizes, while allowing an ASIC to be optimized to increase device speed for ASICs fabricated by an inherently slower source to match the performance of alternately sourced ASICs fabricated by an inherently faster source.

Factors causing the propagation delay, tpd

There are two factors which affect the propagation delay (tpd of any given gate) between the output node and input node of a gate, input loading and interconnect wire loading. Input loading is caused by the input capacitance of the next gate or gates to which an output of a gate is connected.

Interconnect wire loading is caused by the capacitance of the interconnect layers, such as first, second and third layers of interconnect metal, including polycrystalline silicon. If an interconnect is sufficiently thin and long, it is appropriate to consider the distributed resistance (R) of the interconnect, which also provides an RC delay as a part of the interconnect wire loading. FIG. 3 depicts the presence of these two delay components, modelled as input capacitance 38 of building block 36, and interconnect capacitance modelled as capacitance 39.

Accounting for different multiple metal capacitances on different processes

ASICs generally have either two or three layers of interconnect metal, with each metal layer being formed generally perpendicular to the previous metal layer. By way of example FIG. 4 illustrates the two layer metal case, although it is to be understood that the methodology of this invention is readily applicable to integrated circuits having any number of layers of metal.

Figure 4:
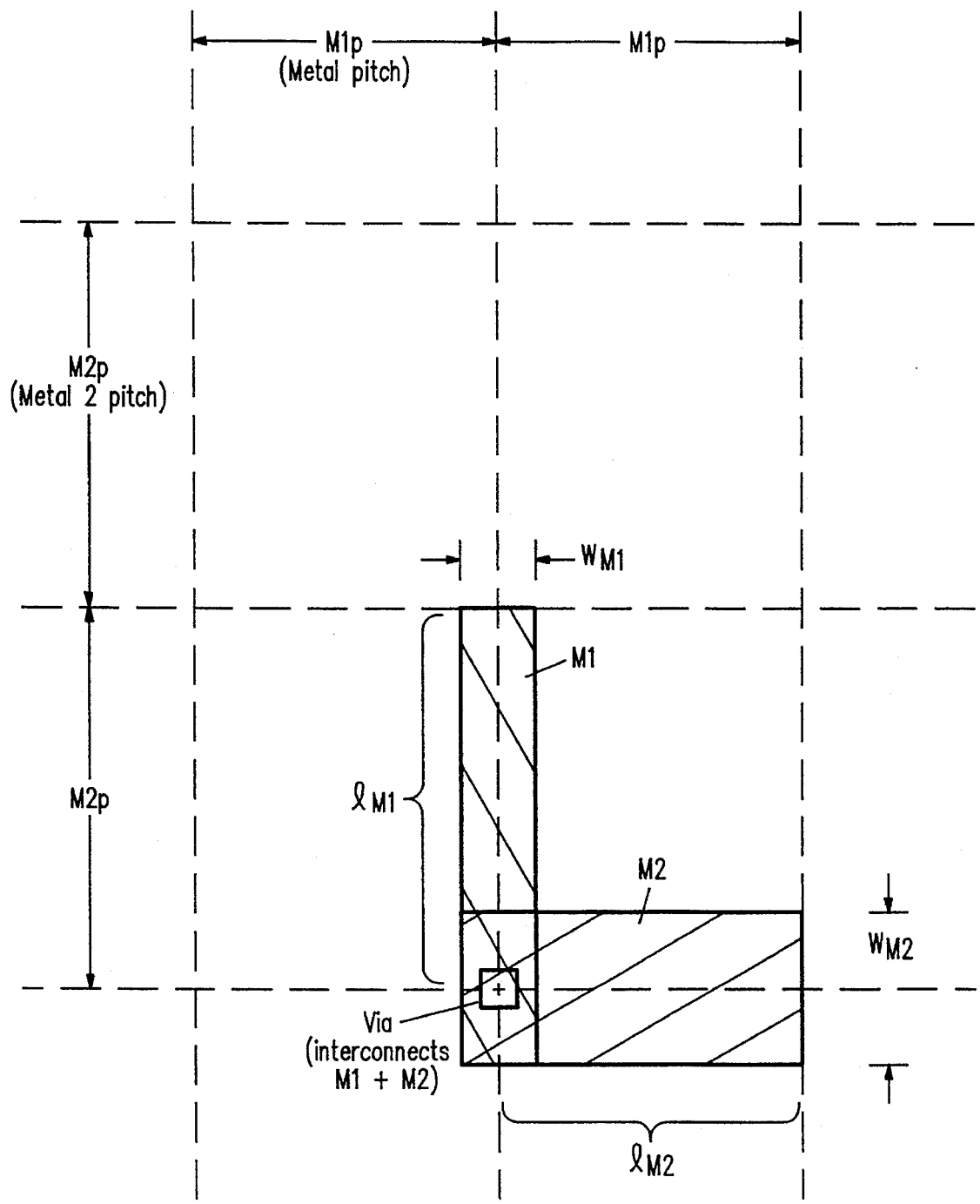
FIG. 4 is a plan view of a portion of an ASIC, showing two layers of metallic interconnects and associated measurements.

Referring to FIG. 4, a grid pattern is formed by first layer metal M1 and second layer metal M2 which is formed perpendicular to M1. The minimum length lm1 of first layer metal m1 is determined by the pitch $M_{2P}$ of second layer metal. Similarly, the minimum length lm2 of second layer metal M2 is determined by the pitch $M_{1P}$ of second layer metal.

Figure 5A:
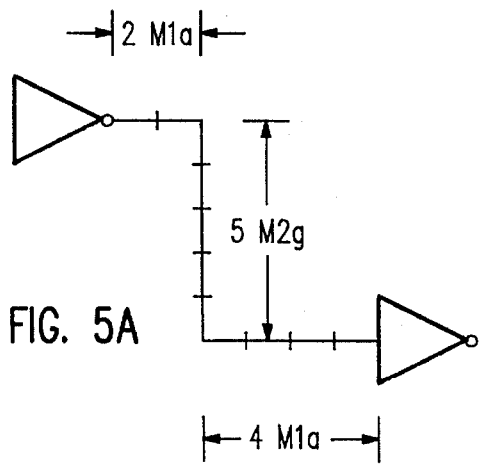
FIGS. 5a and 5b are diagrams depicting routing lengths of similar circuitry constructed by two alternate sources.
Figure 5B:
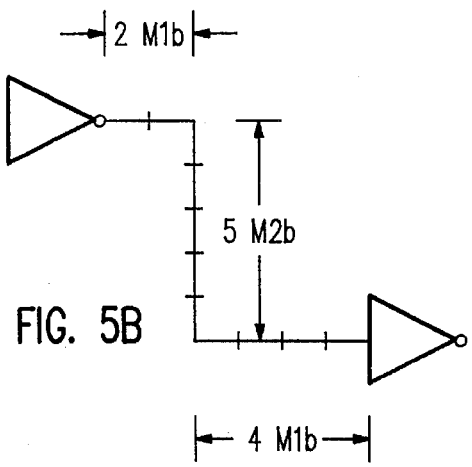

In accordance with the teachings of this invention, the same Place and Route step 505 (FIG. 2) is used regardless of the fabrication sources. This means that any routing path has a fixed number M1g of first layer metal grids of length M2p and a fixed number M2g of second layer metal grids of length m1p, as shown in FIG. 5. In the example of FIG. 5, the metal routing path consists of six M1 grids and five M2 grids. Notice that by expressing the path in units of "grids", the path is the same (in terms of grids) for ASICs fabricated by any alternate source so that, for any given interconnect path, the total number of metal 1 grids M1a of alternate source A equals the total number of metal 1 grids M1b of alternate source B, and the total number of metal 2 grids M2a of alternate source A equals the total number of metal 2 grids M2b of alternate source B, where "A" and "B" refer to alternate sources A and B, respectively. This enables us to design the integrated circuit to the minimum design rules of each fabrication facility.

With respect to FIG. 4, the capacitance for each first layer metal M1 grid and second layer metal M2 grid for each fabrication process is defined as follows:

Cm1A=the capacitance of first layer metal M1 for one vertical grid in the fabrication process of alternate source A;

Cm2A=the capacitance of second layer metal M2 for one horizontal grid in the fabrication process of alternate source A;

Cm1B=the capacitance of first metal layer M1 for one vertical grid in the fabrication process of alternate source B;

Cm2B=the capacitance of second layer metal M2 for one horizontal grid in the fabrication process of alternate source B;

CtwA=the total wire path capacitance of the fabrication process of alternate source A; and CtwB=the total wire path capacitance of the fabrication process of alternate source B.

Referring to the example of FIG. 5:

$$CtwA = 6\ Cm1A + 5\ Cm2A \quad (1)$$

$$CtwB = 6\ Cm1B + 5\ Cm2B \quad (2)$$

In accordance with this invention, Cm1A, Cm2A, Cm1B, and Cm2B are adjusted without cost (die size penalty). Referring to FIG. 7, the metal 1 grid is at a minimum spacing m1p, however, if you look at FIG. 7, the minimum metal width widens to a dogbone shape when there is a contact or via. This is because of the need to have metal overlap around a contact or via. So the minimum metal width can be widened to the dogbone size if metal 1 capacitance needs to be increased. This can be done without cost (no die size increase).

The vertical second metal interconnect grid of the core cell is not metal limited. As you can see from FIG. 7, the second metal grid size is determined by contact size, contact to polycrystalline silicon spacing, polycrystalline silicon size, and polycrystalline silicon to contact spacing, which defines the pitch of the polycrystalline silicon grid. These measurements add up to a number which is much larger than the second metal layer requirements of half of a via area, metal overlap of contact, metal 2 to metal 2 spacing, and half of metal 2 interconnect width. So the metal 2 width could be increased from minimum without increasing die size. We can now increase the width of metal 2 without increasing die size.

Referring to equations (1) and (2) above representing total capacitance for a given path of 6 segments of metal 1 grids and 5 segments of metal 2 grids, consider the general case of a metal path of "a" segments of metal 1 grids and "b" segments of metal 2 grids. In this example, the following equations represent the total metal capacitance of the same path on the two different processes.

$$CtwA = a \times Cm1A + b \times Cm2A \quad (3)$$

$$CtwB = a \times Cm1B + b \times Cm2B \quad (4)$$

If a and b are independent integer numbers, then the above equations can represent any routing path of "a" first metal segments and "b" second metal segments. We would like to make CtwA/CtwB=k. Therefore, it follows that CtwA=k× CtwB. This means that any metal routing path in process A will have a capacitance equal to k times the routing capacitance for the same path (defined in grids) in process B. Even though we need to achieve this goal, this equation is not generally true. However, we can achieve it if we make Cm1A/Cm1B=k, and Cm2A/Cm2B=k.

Therefore, if $$Cm1A = k \times Cm1B \quad (5)$$

$$Cm2A = k' \times Cm2B; \quad (6)$$

where $$k' \neq k \text{ and } k' = Cm2A/Cm2B$$

Then

We can make k' equal to k by either increasing the metal 2 capacitance for process A or the metal 2 capacitance for process B, as needed. Since, as explained above, we can increase the width of metal 2 interconnects without increasing die size, it follows that we can make k' equal to k by increasing metal 2 width in one process in order to increase its capacitance. Now that we make k'=k without increasing die size, the total capacitance for any path in process A is always k times larger than in process B. See below equations 7, 8, and 9.

$$CtwA = a \times Cm1A + b \times Cm2A = a \times (k \times Cm1B) + b \times (k \times Cm2B) \quad (7)$$

$$CtwA = k \times (a \times Cm1B + b \times Cm2B) = k \times CtwB \quad (8)$$

$$CtwA = k \times CtwB \quad (9)$$

With k' now equal to k, as an example if k is 1.08, the capacitance for any given routing path for process A is always 8% larger than the corresponding capacitance for process B. Now we can proceed to the next step, which is adjusting transistor widths, Wp and Wn, to compensate for this 8% difference in metal routing capacitance.

Adjusting the transistor widths to account for any routing path on two alternate fabrication processes The above step of adjusting widths and/or lengths of first and second layer metal has made any metal routing path in the fabrication process of alternate source A to be a fixed percentage larger or smaller than the same path in the fabrication process of alternate source B. In the example above this fixed percentage is 8%.

Figure 6A:
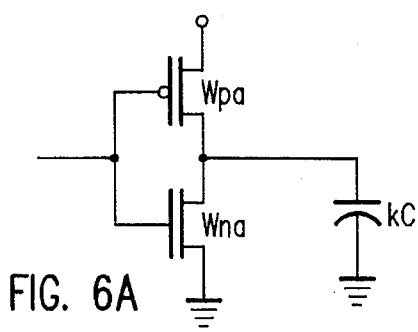
FIGS. 6a and 6b are schematic diagrams depicting similar circuitry constructed by two alternate sources, together with their associated capacitances.
Figure 6B:
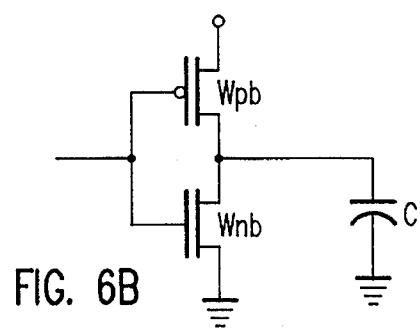

Recognizing that for any given path the metal routing capacitance in process A is always 8% larger than that in process B, we can now proceed to equalize the performance of the circuits in FIGS. 6A and 6B. It is well known that increasing the transistor channel width, W, will proportionately increase the speed performance (i.e reduce the propagation delay). Conversely increasing the load capacitance will proportionately decrease the speed performance (i.e. increase the propagation delay).

We start with the same architecture, and implement the circuits in FIGS. 6A and 6B into design artwork (mask images) to the minimum design rules of process A and to the minimum design rules of process B, assuring ASICs are provided by each alternate source which are as small as possible given the fabrication process design constraints of each alternate source.

We first equalize rise time. In CMOS circuits, rise time is determined by the width Wp of the P channel pull up transistor and the load capacitance. The channel width Wn of the N channel pull down transistor has a negligible effect on rise time, so we can ignore it during rise time computations.

We first simulate performance using, for example a Spice circuit simulator, on the artwork and process parameters of process B for the circuit with load capacitance C. We then simulate performance using the artwork, process parameters, and load capacitance kC for process A. The two propagation delays are compared. If TpdrA (propagation delay of rise time for process A) is 5% slower, we can either increase P channel transistor width WpA of the inherently slower process A by 5%, or decrease the channel of P channel width WpB of inherently faster process B by 5%. We prefer and can generally increase WpA, making the inherently slower process perform as fast as the inherently faster process. This will equalize the rise time performance for corresponding metal routings in both process A and B. Furthermore, when increasing width WpA, we have increased the performance of the inherently slower process to the same speed of the inherently faster process.

We can perform the same operation for the fall time propagation delay. We use Spice to simulate both Tpdf (propagation delay of fall time) for both process A (with a capacitance load of kC) and process B (with a capacitance load of C). We then equalize the propagation delays of processes A and B (for similar metal routings) by either increasing the N channel transistor width WnA of the inherently slower process A, or decreasing the N channel transistor width WpB of the inherently faster process B. We prefer and can generally increase WnA, making the inherently slower process perform as fast as the inherently faster process.

We have now equalized the propagation delay (rise and fall times) of our most basic building block (the inverter shown in FIG. 6A) for metal routings. Since all library elements in gate arrays or embedded arrays, except for I/O (input/output devices), are built from the same building block, then we have also equalized all library elements in the gate array or embedded array for metal routings.

FIG. 7 shows that in horizontal direction, the metal 1 grid spacing is the limiting factor for smallest die size for a given set of design rules. M1p is the smallest first metal pitch that a given set of design rules allow. M1p must allow for half of a contact, metal 1 overlap of contact, metal 1 to metal 1 spacing, and half of a metal 1 interconnect width. Therefore, both Wp and Wn can vary by a delta amount d, without affecting die size. Usually in gate arrays and standard cells, this delta δ is enough to adjust for the metal routing capacitance differences. So our invention allows us to equalize performance for metal routing capacitance differences from two different processes (of the same generation) without die size penalty. So, we accomplished equalization in performance by improving the performance of the inherently slower process, and we did it without increasing the die size. So, in accordance with the teachings of this invention, performance of the inherently slower process is increased to match that of an inherently faster process, without an incremental increase in die size, and thus without an increase in cost.

In this step we have accomplished two things simultaneously: compensating for the constant, k, difference in capacitance due to metal routing between the fabrication processes of alternate sources A and B, as well as equalizing rise and fall propagation delays which could be different between the fabrication processes of alternate sources A and B. In other words we have equalized the relative strengths of the P channel pull up and N channel pull down transistors of both processes.

Equalizing for different input loads of the two processes

Referring to FIG. 3, the metal routing capacitances have been equalized. Now the fabrication processes of alternate sources A and B are, in accordance with this invention, to be equalized to account for differences in propagation delay due to input loading.

Library elements are built from the same basic core cell, for example one P channel transistor of channel width Wp and one N channel transistor of channel width Wn is used exclusively throughout the array. Channel widths Wp and Wn can be, but are not necessarily, equal.

For the case of circuits in which loading is primarily due to gate loading with negligible wire loading, the performance of both fabrication processes are, in accordance with this invention, to be equalized.

The equation which defines the output voltage after a certain time, T, of a capacitive circuit is:

$$V(T) = \frac{1}{C} \int_{t=0}^{t=T} I \, dt \quad (10)$$

where $C = \frac{\epsilon A}{d} = \frac{\epsilon(Wp + Wn)l}{d}$ ; and $$I \alpha \frac{W}{L}$$

Thus $$V(T) \alpha \frac{1}{C} \cdot \frac{Wpd}{l} = \frac{d}{\epsilon(Wp + Wn)l} \cdot \frac{Wpd}{1} \quad (11)$$

and $$V(T) \alpha \left[ \frac{W_{pd}}{W_{pL} + W_{nL}} \right] \frac{d}{P_\epsilon} \qquad (12)$$

where

Wpd=channel width of the driving P channel transistor;
WpL=the channel width of the P channel load transistor; and
WnL=the channel width of the N channel load transistor.

Thus, as shown in equation (13), if we increase Wpd and (WpL+WnL) by the same percentage, there is no change and the effects of increased channel widths cancel.

$$V(T) \alpha \left[ \frac{1.1\, W_{pd}}{1.1(W_{pL} + W_{nL})} \right] \frac{d}{P_\epsilon} \qquad (13)$$

As shown in equations (10)–(13), if we change the sum of Wp and Wn by a certain percentage and we change Wpd by the same percentage, say 10%, which is a multiplying factor of 1.10, then V(T)=the voltage at time, T, after switching is not affected at all. The factor of 1.1 appears in both the numerator and denominator and the change by a, factor of 1.1 cancels, as shown in equation (13).

In other words changing Wp and Wn by the same percentage does not change the speed of the delay due to input loads. The reason is because when we increase the width WpD of the driving transistors, we are also increasing the width WpL and WnL of the load transistors by the same amount. So the increase in drive is canceled out by the increased load capacitance. This shows transistor channel widths can be changed to compensate for different wire loading without affecting the speed due to input loading.

Figure 8A:
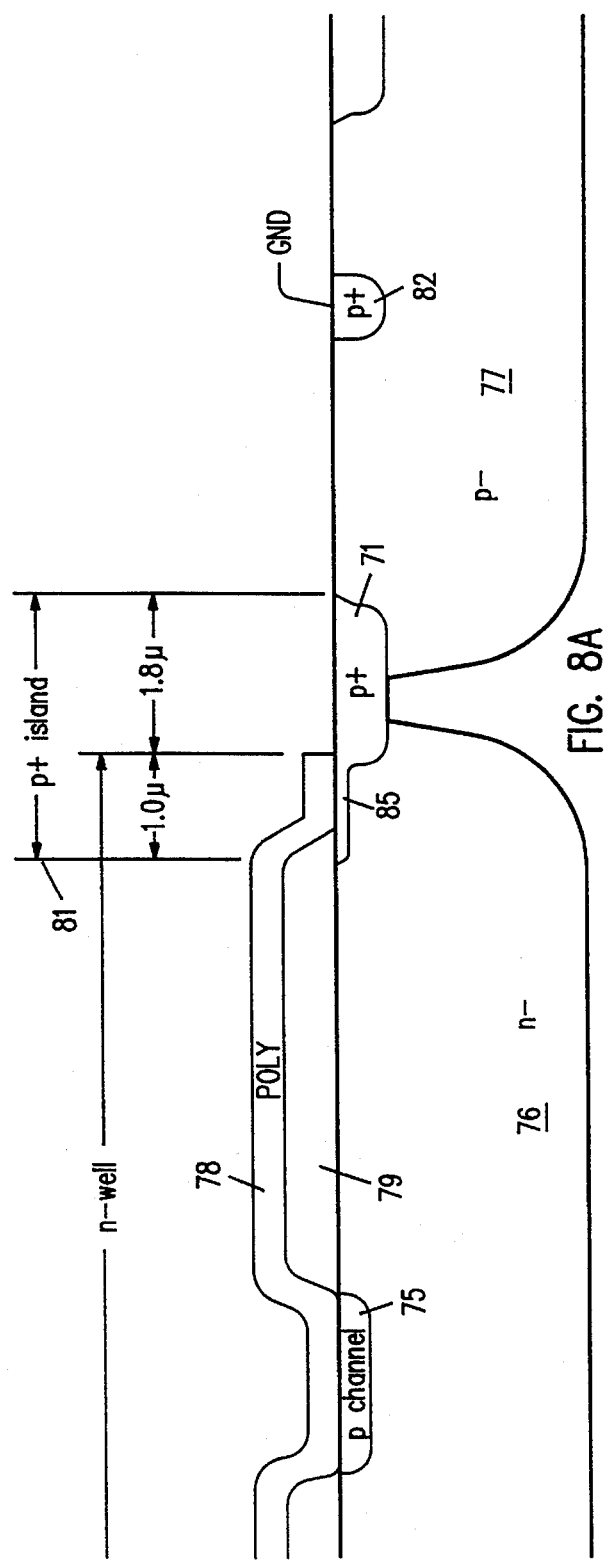
FIG. 8a is a cross sectional view of one embodiment of a capacitor fabricated in accordance with this invention connected to the gate of an ASIC array transistor to affect its operating speed.
Figure 8B:
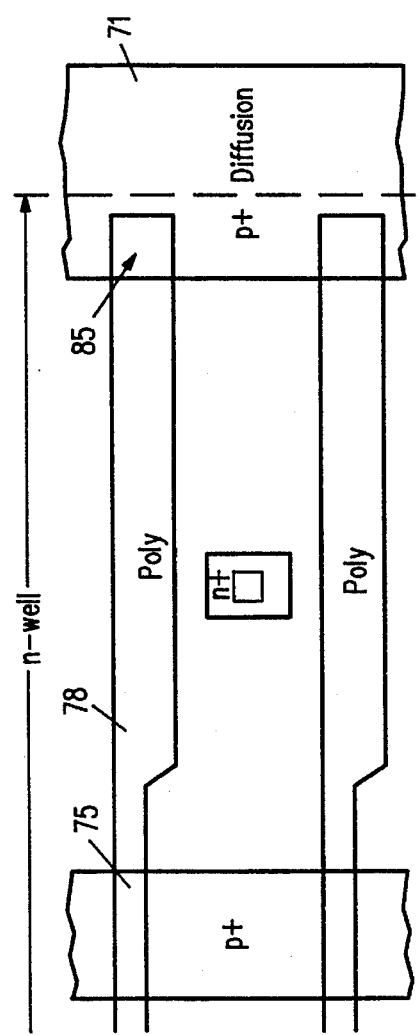

In one embodiment of this invention, a capacitor is used in order to increase the gate capacitance of transistors, and thus the input capacitance of a basic building block, in order to decrease speed to match the speed of an inherently slower process. Such a capacitor is formed in any convenient manner, for example, having a layer of polycrystalline silicon serving as a first capacitor plate insulated from a substrate or doped region within a substrate, serving as a second capacitor plate, by a thin dielectric layer (such as a layer of gate oxide of approximately 150–200 Angstroms in thickness), as shown in FIGS. 8a and 8b. In one embodiment, as shown in the cross sectional view of FIG. 8a, this capacitor consists of a P+ diffusion 71 (which may be conveniently formed during formation of other P+ regions, such as P channel transistor source/drain regions). During formation of P+ region 71, a suitable mask (not shown, but typically of patterned photoresist) is used to form an "island" 81 into which dopants are implanted. However, within this island 81 lies the extended edge of polycrystalline silicon gate electrode 78, which also serves as an implantation mask to cause the region beneath the extended portion of polycrystalline silicon 78 and island region 81 to be masked from implantation of P type dopants and thus remain of N– type conductivity. This causes polycrystalline silicon 78 to be self-aligned with P+ region 71. The overlap of N– well 76 with island 81 and with polycrystalline silicon layer 78 forms a "channel" inversion, which turns the portion of N– well 76 under polycrystalline silicon layer 78 into a P– "channel," much like a P channel transistor except there is no drain, but just the P+ source region 71. As shown in FIG. 8a, P+ source region 71 extends beyond N well 76 into the P– bulk region 77, which in turn is connected to ground by ground contact 82. Therefore the channel underneath the extended edge of polycrystalline silicon 78 is "turned on" and therefore connected to ground when the polycrystalline silicon (gate) voltage is between 0 v and 4.2 v (one P channel threshold) below Vdd. The gate switching voltage is 50% of Vdd or about 2.5 volts for a Vdd of 5 volts. The capacitor, being present between 0 and 4.2 volts, is present during most of the switching time. So in this voltage range one node of the capacitor is at ground while the other node is automatically connected to the input polycrystalline silicon load. This capacitor increases input loading without increasing drive strength. This "equalizing" capacitor comes for free, as it fits into our gate arrays and embedded arrays without requiring an increase in area. No additional contacts to ground are needed for the capacitor, as P+ region 71 is connected to ground through P– bulk region 77, and no dedicated contact to polycrystalline silicon is needed.

Figure 9:
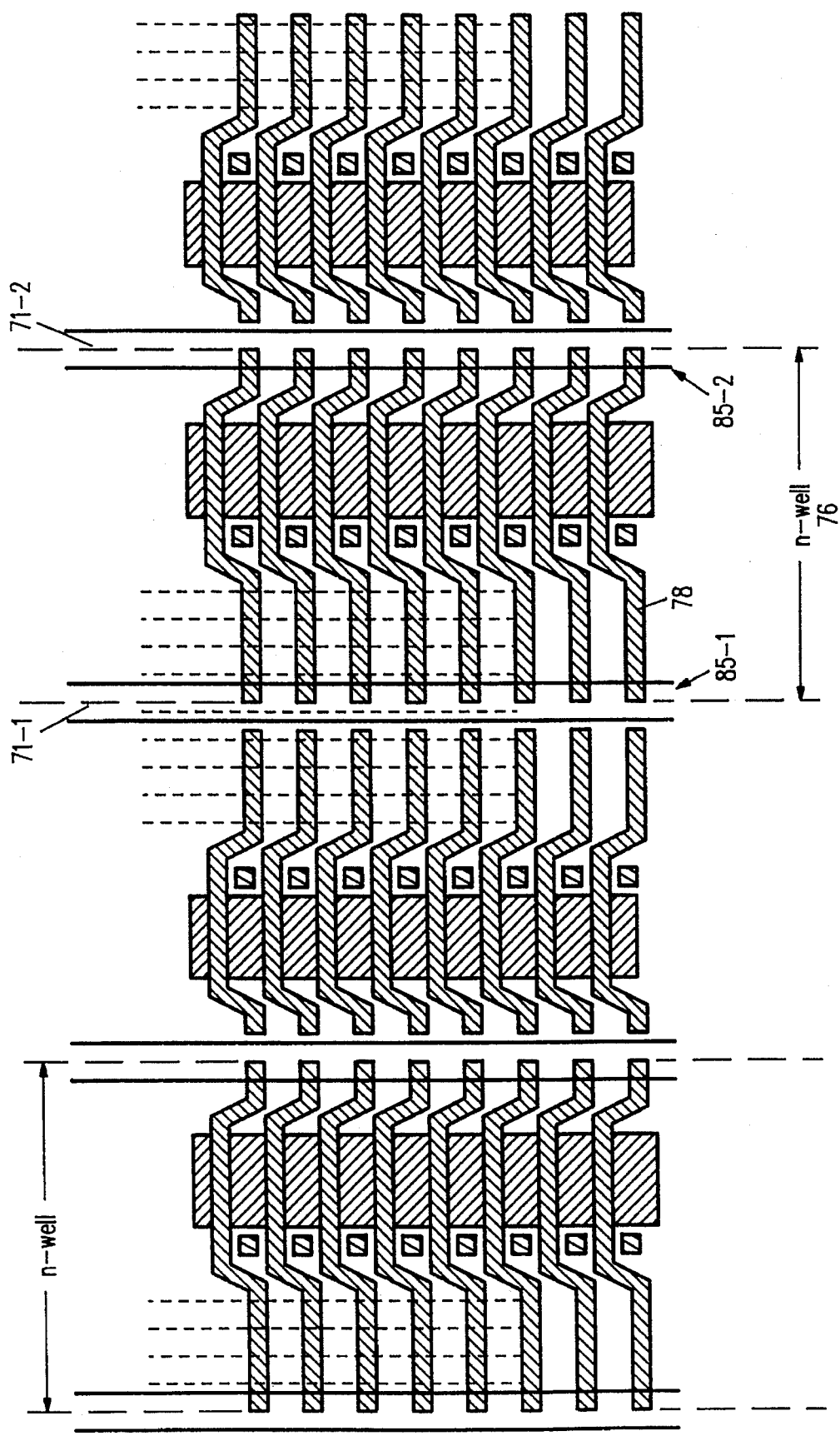
FIG. 9 is a plan view of a larger portion of an ASIC depicting the formation of the capacitors of FIG. 8a on both sides of a diffusion strip, in accordance with one embodiment of this invention.

FIG. 9 shows a plan view of one embodiment in which such a capacitor is formed as two portions 85-1 and 85-2, one portion for each of the two ends of gate 78 of the P channel transistor. In this embodiment, each end has its own P+ source/drain diffusion strip 71-1 and 71-2, to compensate for any misalignment between the polycrystalline silicon mask and the P+ source/drain mask. Thus, in accordance with this embodiment, if the polycrystalline silicon mask is misaligned to the left, the capacitance of the left capacitor 85-1 is increased by the same amount the capacitance of right capacitor 85-2 is decreased, and vice versa. Therefore, this embodiment provides for a capacitor that is insensitive to polycrystalline silicon misalignment with respect to P+ source/drain regions.

In an alternative embodiment, an N+ source/drain region is used instead of P+ source/drain region 71 of FIG. 8a. As in the previously described embodiment, the N+ overlaps both the P– and N– regions. The polycrystalline silicon capacitor is formed on the P– side and the N+ source/drain reaches into the N– region, which provides a connection to Vdd (instead of a connection to ground, as in the previous embodiment) to one side of the polycrystalline silicon capacitor. The other side of the capacitor is automatically connected to the polycrystalline silicon. In this case, the capacitor is effective when the N channel is turned on between 0.8 V to 5 V (i.e. after the 0.8 volt N-channel transistor threshold voltage is reached).

Following the place and route step 505 (FIG. 2), the ASIC device has been defined in a manner suitable for allowing alternately sourced ASICs to be provided by a plurality of vendors with only a minor mask adjust step (506-I through 506-N) required in order to properly adapt the ASIC design developed utilizing steps 501 through 505 for fabrication using the specific fabrication process of a given vendor, including its specific performance parameters. Thus, for example, a first vendor who will perform fabrication step 507-1 to provide a first ASIC device meeting the requirements of the designer as specified during specification step 501, utilizes the ASIC as defined by steps 501 through 505 and applies a mask adjustment (step 506-1) to the minimum design rules (smallest die size) of that lab, thereby adapting the ASIC design resulting from place and route step 505 to that first ASIC vendor's specific design rules and process parameters. Similar mask adjustment steps are performed for each separate ASIC vendor so that the ASIC devices provided by each vendor via its fabrication process 507-2 through 507-N are functionally and timing equivalent to each other and meet the requirements of the designer as specified during specification step 501. During these mask adjustment steps 506-1 through 506-N, the metallization, which limits the die size, is adjusted to the minimum design rules of each fab for the smallest die size that particular lab is capable of producing. Also, P and N channel transistor widths are adjusted to compensate for process differences. Since the die size is metal limited, and due to the metal pitch there is up to approximately 15–20% variation allowed in channel widths without affecting die size, we can adjust for performance by approximately 15–20% without an increase in die size.

Figure 2:
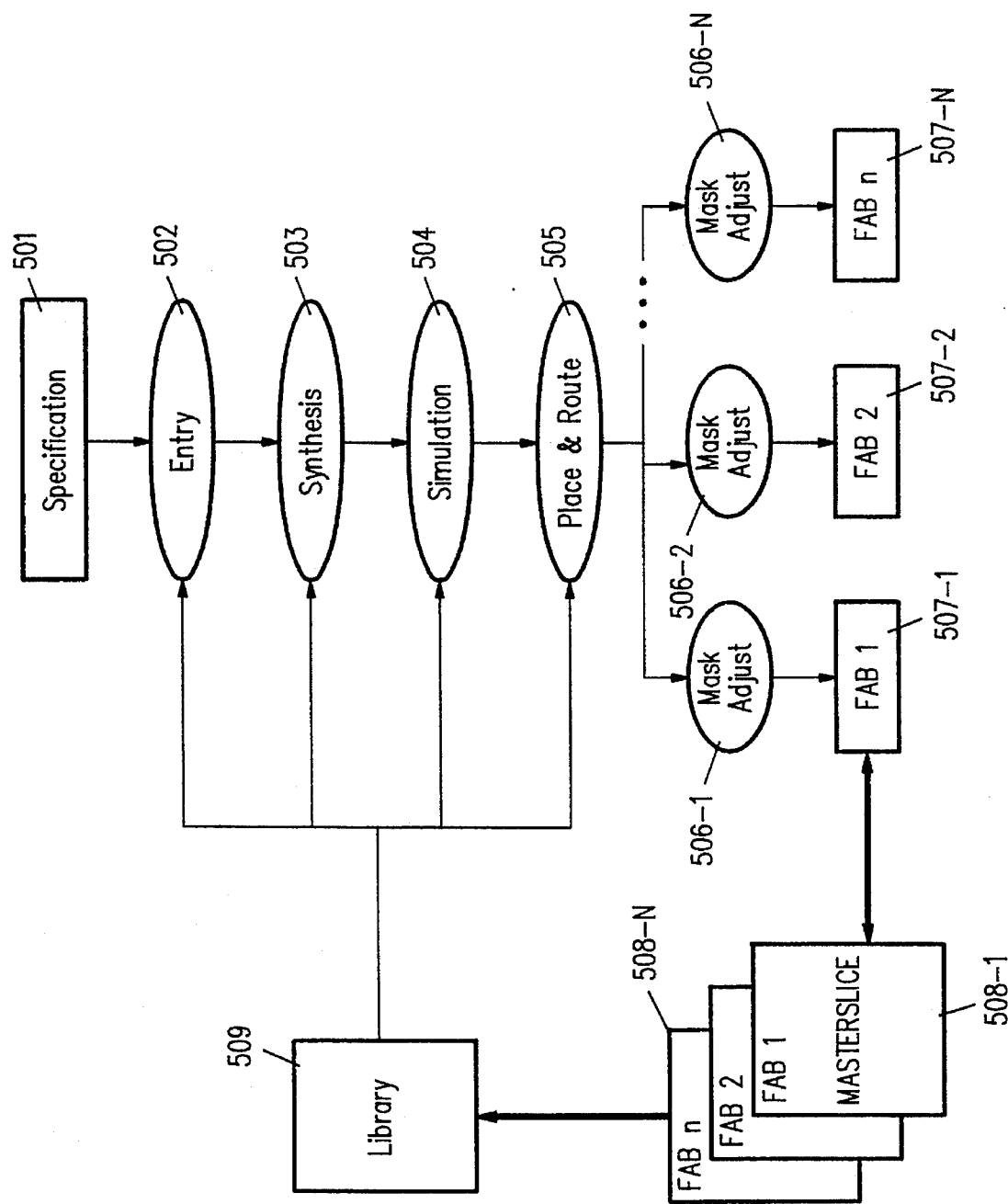
FIG. 2 is a diagram depicting the design and fabrication of ASICs from a plurality of alternate sources in accordance with one embodiment of this invention.

FIG. 2 shows that, in accordance with this invention, the process parameters (such as may be defined by Spice parameters and design rules) for each alternate source fabrication facilities, equalize the performance of devices to be fabricated by each alternate source, and generate a single library with he same functionality and timing performance in order to generate models for steps 502 through 505 of FIG. 2. In this manner a customer with a desired function uses library 509 which is applicable to the plurality of alternate source fabrication facilities. Further, by using the same place and route step 505, correspondingly similar wire lengths are assured among the corresponding ASICs fabricated by alternate sources. During the mask making process, masks are adjusted (in mask adjust steps 506-1 through 506-N) to the minimum design rules for each alternate source, allowing each alternate source to produce the smallest (and thus least costly) integrated circuit permitted under its design rules.

The teachings of this invention are equally applicable to standard cell devices since the size of standard cell devices in most cases is limited in the direction of channel width Wp and Wn by the pitch of the first interconnect layer, as has been described above with respect to array devices. The metal 2 pitch, as in gate arrays, is also limited by half of a contact, contact to poly spacing, poly, poly to contact spacing, and half of a contact. This distance is much larger than the minimum metal 2 pitch. Therefore, metal 2 width can be increased without affecting die size.

The invention now being fully described, it will be apparent to one of ordinary skill in the art that many changes and modifications can be made thereto without departing from the spirit or scope of the appended claims.

What is claimed is:

1. A method for fabricating a plurality of integrated circuits from a plurality of alternate sources, each of said plurality of integrated circuits performing substantially identically regardless of inherent process differences of said plurality of alternate sources, comprising the steps of:

designing a circuit to perform a desired electrical function;

determining a first characteristic capacitance for a given electrical interconnect routing for an integrated circuit produced by a first alternate source using a first fabrication process;

determining a second characteristic capacitance for a similar electrical interconnect routing for an integrated circuit produced by a second alternate source using a second fabrication process;

determining a difference in said first and second characteristic capacitances;

laying out said circuit to provide a first layout for fabrication by a first alternate source using said first fabrication process; and adjusting said first layout to adapt for said difference in said first and second characteristic capacitances to provide a second layout for fabrication by said second alternate source using said second fabrication process, by adjusting said first layout to provide said second layout by adjusting electrical interconnect widths to alter the capacitance associated therewith to compensate for said difference in characteristic capacitances.

2. A method as in claim 1 wherein said step of adjusting said first layout to provide said second layout comprises the step of adjusting electrical interconnect widths to alter the capacitance associated therewith to compensate for said difference in characteristic capacitances.

3. A method as in claim 1 wherein said step of adjusting maintains the length of metal interconnects, as measured by the number of grid spacings.

* * * * *